United States Patent

Manohar et al.

[19]

[11] Patent Number: 5,917,340
[45] Date of Patent: Jun. 29, 1999

[54] TWISTED-PAIR DRIVER WITH STAGGERED DIFFERENTIAL DRIVERS AND GLITCH FREE BINARY TO MULTI LEVEL TRANSMIT ENCODER

[75] Inventors: Amar S. Manohar; Bor Lee, both of San Jose, Calif.

[73] Assignee: Pericom Semiconductor Corp., San Jose, Calif.

[21] Appl. No.: 08/946,739

[22] Filed: Oct. 8, 1997

[51] Int. Cl.[6] .................. H03K 17/16; H03K 17/687; H03K 19/003; H03K 19/0185
[52] U.S. Cl. ....................... 326/82; 326/27; 326/29; 326/60; 326/83; 326/87
[58] Field of Search ................ 326/26–29, 56–58, 326/59–60, 82–83, 87

[56] References Cited

U.S. PATENT DOCUMENTS

| | | | |
|---|---|---|---|
| 4,533,878 | 8/1985 | Rehm et al. ........................... 330/261 |
| 5,111,080 | 5/1992 | Mizukami et al. .................. 326/86 X |
| 5,122,690 | 6/1992 | Bianchi ..................................... 326/87 |
| 5,263,049 | 11/1993 | Winen et al. ............................. 375/36 |
| 5,355,391 | 10/1994 | Horowitz et al. ....................... 375/36 |
| 5,418,478 | 5/1995 | Van Brunt et al. ...................... 326/86 |
| 5,467,369 | 11/1995 | Vijeh et al. ............................. 375/224 |
| 5,485,488 | 1/1996 | Van Brunt et al. .................... 375/257 |
| 5,504,728 | 4/1996 | Yokota et al. ............................ 369/58 |
| 5,519,728 | 5/1996 | Kuo ........................................ 375/257 |
| 5,528,636 | 6/1996 | Sevenhans et al. .................... 375/371 |
| 5,739,707 | 4/1998 | Barraclough .......................... 326/87 X |

*Primary Examiner*—David Mis
*Attorney, Agent, or Firm*—Stuart T. Auvineu

[57] ABSTRACT

A twisted-pair current driver is implemented in CMOS. EMI from sharp changes in the current driven is reduced by gradually changing the current driven when the inputs change. The current driver is divided into N differential drivers, each driving one-Nth of the total switching current to the twisted pair. Delay lines delay when input changes are sent to each of the four differential drivers, staggering their response. Either binary or multi-level-transition (MLT-3) data can be transmitted. A binary-to-MLT converter uses a dummy flip-flop to match delays and eliminate encoding glitches. Either the binary or the MLT-3 encoded data is coupled to the inputs of the delay lines and the differential drivers. The mid-level for MLT-3 is driven when both the inputs are high, causing the differential drivers to split the current among the two differential outputs to the twisted pair. The amount of current switched by each differential driver is doubled for multi-level mode to allow receivers to observe the smaller, multiple steps.

19 Claims, 6 Drawing Sheets

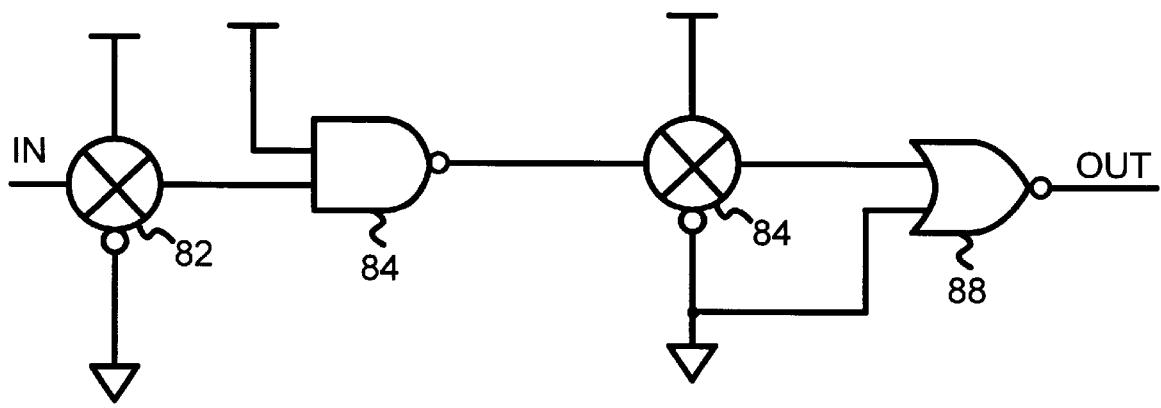
FIG. 8      70

5,917,340

TWISTED-PAIR DRIVER WITH STAGGERED DIFFERENTIAL DRIVERS AND GLITCH FREE BINARY TO MULTI LEVEL TRANSMIT ENCODER

BACKGROUND OF THE INVENTION—FIELD OF THE INVENTION

This invention relates to network-cable drivers, and more particularly to a twisted-pair cable driver using CMOS.

BACKGROUND OF THE INVENTION— DESCRIPTION OF THE RELATED ART

The rapid expansion of computer networks has created a greater need for lower-cost and higher-performance networks. Low-cost cabling is commonly used to connect different computer workstations and servers on a network. Twisted-pair cables ensure uniformity of signal losses and impedances since the signal wires are twisted around each other. Shielded twisted-pair (STP) cables reduce interference from electro-magnetic interference (EMI), but shielding increases cable cost. Unshielded twisted-pair (UTP) cables are less expensive, but more susceptible to EMI.

Since the cables are often fairly long, perhaps up to one-hundred meters, a relatively strong driver is needed to transmit data over the cable. Traditionally, cable drivers were separate semiconductor chips employing bipolar NPN transistors arranged as Emitter-coupled logic (ECL) gates. More recently, higher integration has forced the cable drivers onto complementary metal-oxide-semiconductor (CMOS) chips. Sometimes the CMOS process is modified to include high-drive bipolar NPN transistors. While effective, these BiCMOS processes are more expensive than standard CMOS. Thus, it is more desirable to use standard CMOS processes rather than BiCMOS.

Twisted-pair cables are usually terminated at the receiver end, and current drivers are used to vary the amount of current driven out through the cable. The receiver can detect voltage changes across the termination as the amount of current driven changes. Typically, small voltage changes are detected because limited current changes are possible in a short cycle time. Small-signals are used to reduce current requirements and increase speed.

Ground Bounce And Interference Problem

Ground bounce is a serious problem with high-speed drivers. The internal ground planes in an integrated circuit chip can bounce higher when a large current increase occurs, such as when a driver is enabled. The inductance of the chip's package limits the amount of current change, producing a voltage rise in the internal ground.

High-frequency signals applied to the parasitic inductances of the twisted-pair cable also limit the current being switched, and the magnetic fields caused by the cable inductances can cause EMI for other nearby signals.

Various wave-shaping techniques have been used to reduce the change in current, di/dt. A technique used with CMOS totem-pole drivers is to divide the large driver transistors into several legs, and gradually turn these legs on to prevent large current spikes. While such techniques have been successful with full-swing voltage drivers, the inventors are not aware of current drivers using a staggering technique.

Differential Signals To Cancel Interference

High-speed communications networks such as Fast (100 Mbps) Ethernet and asynchronous-transfer-mode (ATM) networks use differential signals for transmitting data. The speed of these differential signals is increased when they transition over a reduced voltage range, since output capacitances are charged and discharged over a smaller voltage range, requiring less current.

Multi-Level Signaling—FIG. 1

Another desirable feature for a twisted-pair driver is the use of multi-level transitions (MLT). MLT allows more information to be encoded into a signal than for binary transitions. Thus, slower MLT transmission rates can achieve the same data throughput as high-rate binary signals.

FIG. 1 is a waveform diagram of binary and MLT encoding. A non-return-to-zero (NRZ) waveform 11 is encoded to a NRZ-invert-on-ones (NRZI) waveform 13 by causing a transition to occur for each NRZ one, but no transition to occur for each NRZ zero. NRZI waveform 13 is considered a better encoding for data transmission than NRZ waveform 11 because transitions occur with more regularity. Encoding can lower transition rates by one-half or more.

NRZI waveform 13 can be transmitted as a pair of differential signals TX+, TX− by transmitting NRZI as TX+ waveform 15 and transmitting a complement of NRZI as TX− waveform 17. Of course, TX+, TX− waveforms 15, 17 have a small voltage swing of perhaps 0.8 volts, peak-to-peak.

For MLT encoding, each transition of NRZI waveform 13 causes a transition of MLT waveforms 9, 19. Like binary differential signals, MLT differential signals are complements of each other. When TX+ is high, TX− is low, and vice-versa. Both TX+ and TX− can be at the middle voltage level at the same time. A larger peak-to-peak voltage swing of 1.6 volts can be used for MLT signals so that each transition is 0.8 volt.

Multi-Level Encoder—FIG. 2

FIG. 2 is a diagram of a prior-art multi-level encoder. A binary signal BIN_IN is to be converted to multi-level-transition-3 (MLT-3) format. BIN_IN clocks flip-flop 10 on each rising edge. Flip-flop 10 operates like a toggle flip-flop, changing state on each rising clock edge. The QN output of flip-flop 10 is fed back to its D input. A reset (not shown) may be added to flip-flop 10 for initialization.

AND gate 12 outputs signal A as the logical AND of BIN_IN and the Q output of flip-flop 10. NAND gate 14 outputs signal B as the logical NAND of BIN_IN and the QN output of flip-flop 10. Signals A and B are used as intermediate signals for representing input BIN_IN as a multi-level-logic signal for output to a twisted-pair cable.

FIG. 3 is a waveform diagram of the binary-to-MLT encoder of FIG. 2. Each rising edge of the binary input BIN_IN clocks flip-flop 10 of FIG. 2, toggling Q and QN, which are inverses of each other. Signal A is the AND of BIN_IN and Q, while signal B is the NAND of BIN_IN and QN. When Q is high and BIN_IN is high, A is high.

Because the flip-flop has a finite clock-to-output delay, signals Q, QN do not change when input BIN_IN changes. This results in a timing hazard resulting in glitches 16 after BIN_IN rises when Q is still high. Signal A briefly pulses high before returning low. Signal B likewise has glitches 18 immediately after a rising edge of BIN_IN when Q is low. Such glitches 16, 18 are undesirable, especially for data transmission over a network where the clock is extracted from the data stream. False clocks can be detected at the receiver when such an encoder is used before the encoded data is transmitted.

What is desired is a driver circuit for twisted-pair cables. It is desired to use standard CMOS rather than BiCMOS to reduce cost and ease integration. It is desired to reduce EMI and ground bounce on the driver chip by shaping transitions of the current-driven outputs. It is desired to apply output-staggering techniques to a current driver having differential, small-signal outputs to a twisted-pair cable. It is desired to drive either binary-encoded or multi-level-transition-encoded data with the same current driver circuit. An option in the current-driver circuit to drive the twisted-pair for either binary or MLT-3 signals is desired. An encoder to convert binary signals to multi-level signals is desired. It is desired to reduce or eliminate glitches in a binary-to-MLT-3 encoder.

SUMMARY OF THE INVENTION

A multi-level and binary current-driver for a twisted-pair cable has a plurality of differential current drivers each with a pair of inputs and a pair of outputs. The pair of outputs for all differential current drivers are connected to drive a differential pair in the twisted-pair cable. A delay line successively delays the pair of inputs to successive differential current drivers such that each differential current driver receives changes on the pair of inputs at different times. A mode signal indicates when binary data and when multi-level data is to be output from the plurality of differential current drivers.

A multi-level encoder receives a binary data stream. It converts the binary data stream into a multi-level-transition data stream. A multiplexer receives the binary data stream and receives the multi-level-transition data stream from the multi-level encoder. It outputs the pair of inputs to the delay line means in response to the mode signal. The pair of inputs are a high signal and a low signal when the binary data stream is output from the multiplexer means, but the pair of inputs are a high signal and a low signal or two high signals when the multi-level-transition data stream is output from the multiplexer means. Thus binary and multi-level data are output by the plurality of differential current drivers.

In further aspects of the invention electromagnetic interference (EMI) from the twisted-pair cable is reduced by successively delaying current switching from successive differential current drivers.

In still further aspects the multi-level encoder has a toggle flip-flop that toggles toggled outputs in response to the binary data stream. A dummy flip-flop delays the binary data stream by a similar delay to a delay through the toggle flip-flop to generate a delayed binary data stream. A decode means receives the toggled outputs from the toggle flip-flop and receives the delayed binary data stream from the dummy flip-flop. It outputs multiple signals that encode the binary data stream as the multi-level-transition data stream.

In still further aspects each of the plurality of differential current drivers further has a current-source p-channel transistor connected to a power supply for outputting a constant current. A first p-channel differential transistor and a second p-channel differential transistor are connected to the current-source p-channel transistor to receive the constant current. Each p-channel differential transistor is controlled by one of the pair of inputs and outputs the constant current to one of the pair of outputs in response to the pair of inputs. An additional current-source p-channel transistor is connected to the power supply to output a constant additional current.

A mode p-channel transistor is coupled between the additional current-source p-channel transistor and the first and second p-channel differential transistors. It increases current switched by the first and second differential p-channel transistors in response to the mode signal that indicates that the multi-level-transition data stream is to be outputted. The first and second p-channel differential transistors also outputs the constant additional current when the multi-level-transition data stream is to be outputted. Thus current switched is increased for the multi-level-transition data stream.

BRIEF DESCRIPTION OF THE DRAWINGS

FIG. 8 is a diagram of a dummy flip-flop used to match delays in the MLT encoder to eliminate glitches.

DETAILED DESCRIPTION

The present invention relates to an improvement in twisted-pair CMOS drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that twisted-pair cable drivers must switch a large amount of current to drive even small signals onto a long cable. Losses and parasitic inductances are significant for long cables. At high frequencies, this large amount of current must be switched in a very short time. A standard current driver immediately switches this current from one differential signal to the other, resulting in sharp discontinuities in the current, producing magnetic fields from the parasitic inductances in the cable. These magnetic fields can cause EMI noise in nearby signals, such as other nearby cabling or other twisted-pairs in a large cable.

The inventors have realized that ground-bounce techniques used for full-swing CMOS output buffers can be applied to current drivers. Modification is needed to apply these techniques to differential current drivers because current drivers are not simple totem pole buffers.

Figure 4:
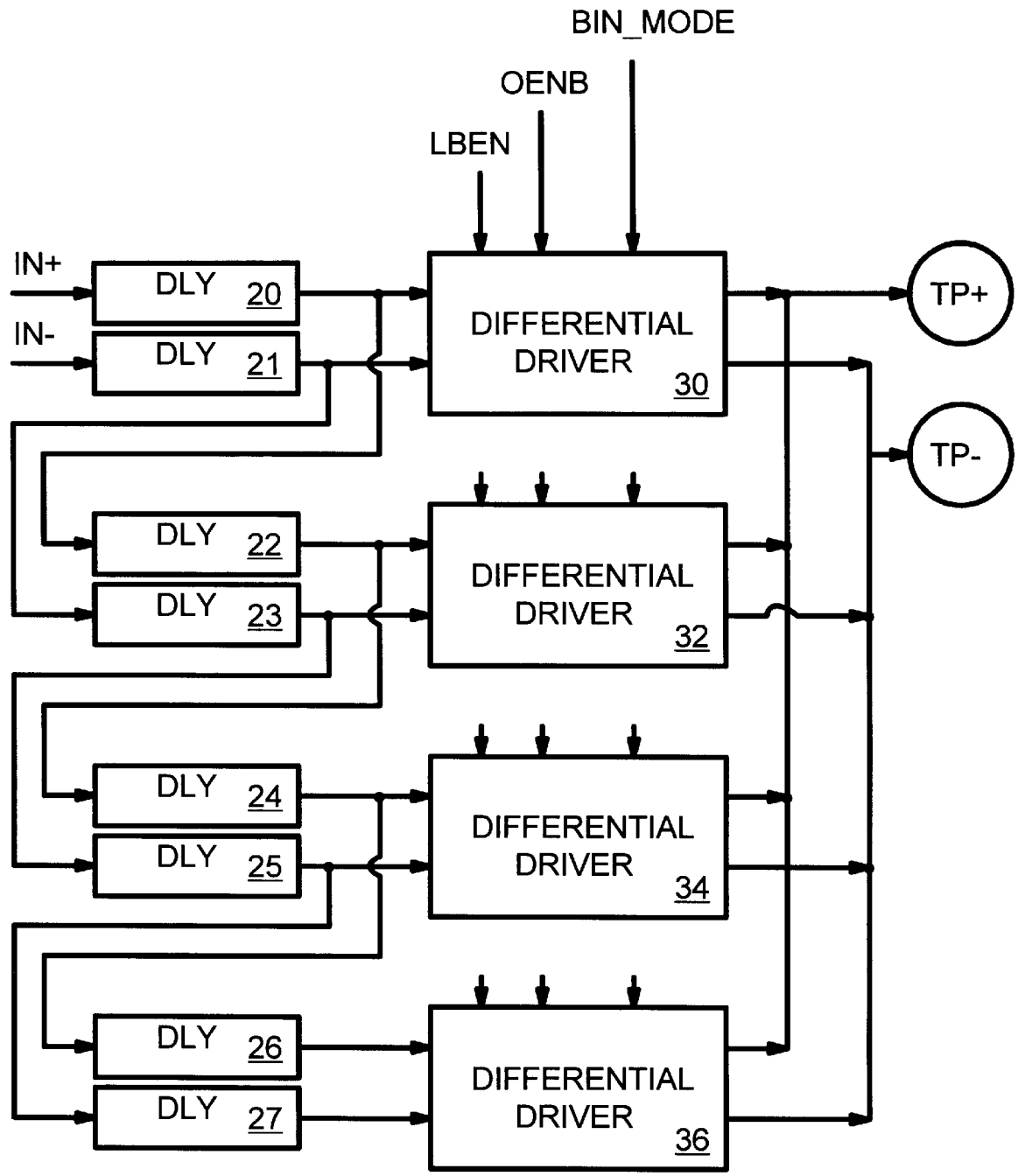
FIG. 4 is a diagram of a current driver with input delays to stagger current switching.

Staggered Differential Current Driver—FIG. 4

FIG. 4 is a diagram of a current driver with input delays to stagger current switching. The output waveform is smoothed by gradually switching current from one differential output to the other. The controlled edge-rate of the smoother output waveform generates less EMI.

Two inputs are received, IN+ and IN−, carrying a differential signal. Inputs IN+, IN− are full-swing binary signals, which carry encoded data, either binary or multi-level-transition-3 (MLT-3) data. For binary data, IN+ and IN− are always in opposite states, while for MLT-3 encoding IN+ and IN− can both be high or low to cause differential drivers 30–36 to output an intermediate voltage.

Delay line 20 delays input IN+ before input to differential driver 30, while delay line 21 delays input IN− before input to differential driver 30. The amount of delay in delay lines 20–27 are all approximately the same, about 0.5 nanosecond (ns) each. Thus changes in inputs IN+, IN− reach first differential driver 30 about 0.5 nanosecond before reaching second differential driver 32 through delay lines 22, 23. Delay lines 24, 25 delay IN+, IN− to third differential driver 34 by an additional 0.5 nanosecond, while delay lines 26, 27 increase the total delay to fourth differential driver 36 to 2 nanoseconds.

Thus a change in inputs IN+, IN− is propagated to first differential driver 30, then to second differential driver 32 about 0.5 ns later. One nanosecond later third differential driver 34 receives the input change, and 1.5 ns after first differential driver 30 receives the change, fourth differential driver 36 receives the input change. Each of differential drivers 30, 32, 34, 36 receives a change in inputs IN+, IN− at a different time, staggered at half-nanosecond intervals.

This input staggering causes the current driven to gradually change. First, one-quarter of the total current is switched from one differential output to the other. Then another quarter of the current is switched, then a third quarter of the current, and finally the last quarter of the current, 1.5 ns after the first quarter-current change occurred.

Each differential output of differential drivers 30, 32, 34, 36 is connected together with the outputs from the other differential drivers and to output pins TP+, TP−. Output pins TP+, TP− drive the twisted pair, or preferably a transformer isolating the twisted-pair from the current-driver chip.

Separate delay lines are required for each of the two differential inputs IN+, IN−. These delay lines should be matched as much as possible to reduce output distortion.

Differential drivers 30, 32, 34, 36 each receive additional control inputs. A loop-back test mode is entered when LBEN is high, forcing both differential outputs TP+, TP− to a mid-level voltage. When output-enable OENB is low, the outputs are put in a high-impedance state by disabling the current drivers in differential drivers 30, 32, 34, 36. Binary mode signal BIN_MODE is high for binary signaling, but low for MLT-3 signaling. Outputs TP+, TP− switch between a high-current and a low-current state when BIN_MODE is high, but switch between high-, low-, and medium-current states when BIN_MODE is low, enabling multi-level signaling.

Figure 5:
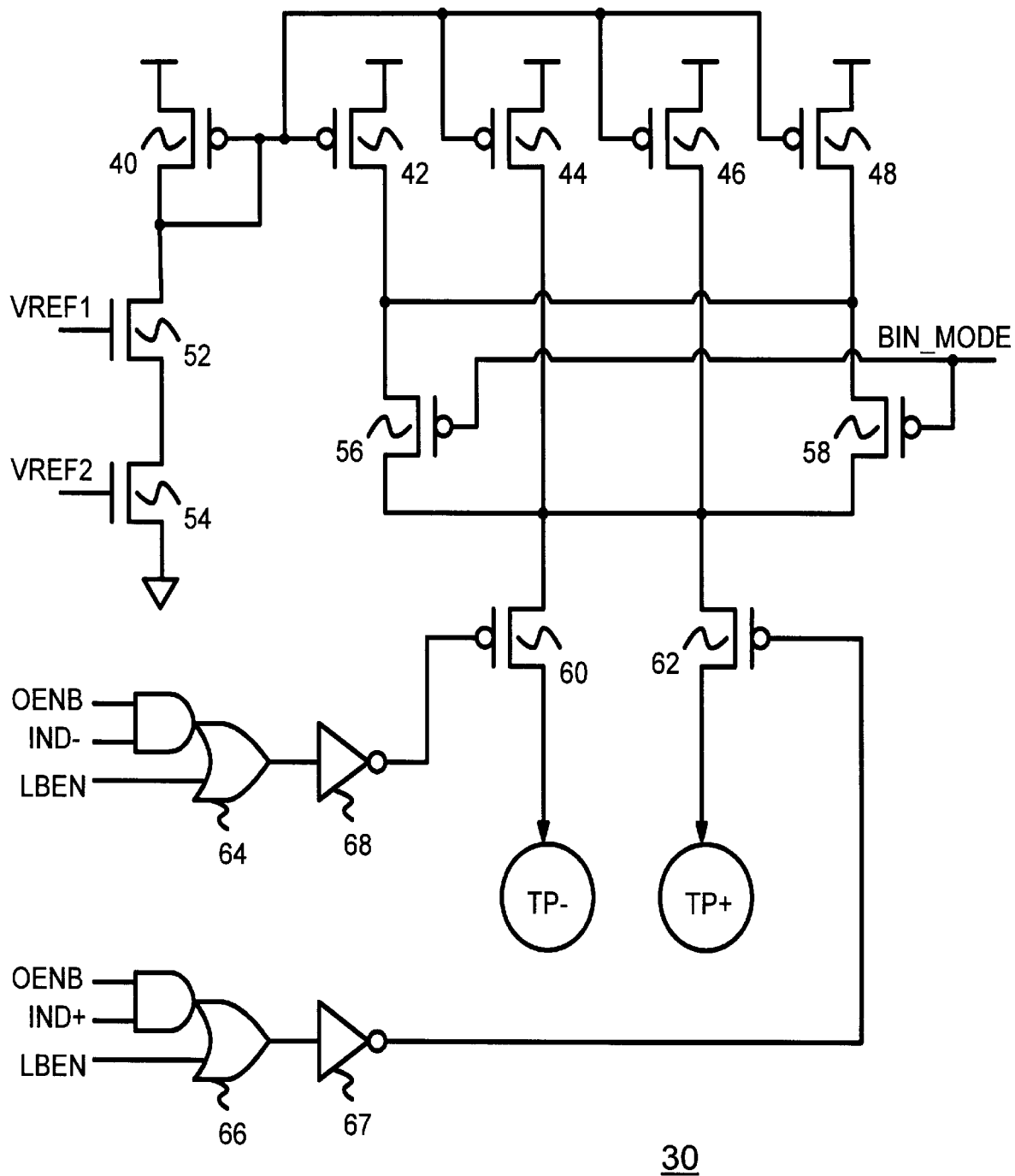
FIG. 5 is a schematic of a differential current-driver having one-quarter of the total current drive to a differential pair of outputs.

Quarter-Current Differential Driver—FIG. 5

FIG. 5 is a schematic of a differential current-driver having one-quarter of the total current drive to a differential pair of outputs. Differential current driver 30 of FIG. 5 is used for differential current drivers 30, 32, 34, 36 of FIG. 4, each supplying one-fourth of the total current drive to outputs TP+, TP−. P-channel transistors 42, 44, 46, 48 are current-source transistors, each outputting about 1.25 milli-amps to differential switch transistors 60, 62. The differential inputs IND+, IND−, output from the delay lines of FIG. 4, are applied to differential switch transistors 60, 62 through AND-OR gates 64, 66. Since differential switch transistors 60, 62 are p-channel transistors, inverters 68, 67 produce an actives output to enable the p-channel gates of differential switch transistors 60, 62. When IND+ is high and IND− is low, current is switched through differential switch transistor 62 while differential switch transistor 60 is turned off.

Signal OENB is driven low when the TP+, TP− outputs are to be disabled. When OENB is low, AND-OR gates 64, 66 output a low, which is inverted by inverters 68, 67. The high gate-voltages on differential switch transistors 60, 62 turn them both off. No current is driven to outputs TP+, TP−, as they enter a high-impedance state.

During loop-back test mode, the outputs are both driven to the same mid-voltage level. Signal LBEN is high, forcing the outputs of AND-OR gates 64, 66 high, enabling both differential switch transistors 60, 62. Since both transistors 60, 62 are on, the total current is split evenly among the two outputs TP+, TP−. This results in half of the normal high-state current being output. The voltage drop generated across the termination is half the normal drop, resulting in a mid-voltage level being seen by a receiver.

MLT Mode Increases Current

Since multi-level MLT-3 signals transition between three states, while binary signals transition only between two states, it is desirable to increase the amount of current switched for MLT-3 mode. The higher current in MLT-3 mode increases the peak-to-peak voltage swing across the termination for the three states. A receiver is then better able to detect and decode the multi-level signals. The current from current-source transistors 42, 48 is blocked by mode transistors 56, 58 when binary-mode signal BIN_MODE is high. During MLT-3 mode when BIN_MODE is low, p-channel mode transistors 56, 58 are on, delivering the additional current from current-source transistors 42, 48 to the sources of differential switch transistors 60, 62. The switching current is effectively doubled when mode transistors 56, 58 are on, doubling the voltage swing produced across the termination during MLT-3 mode.

The same driver circuit can be used for either binary signaling or for multi-level signaling. A second circuit is not needed. The driver manufacturer does not have to build and stock two separate chips for the two applications, reducing cost.

A current mirror is used to set the bias voltage for the gates of p-channel current-source transistors 42, 44, 46, 48 so that all deliver the same current when sized the same. Mirror transistor 40 is a p-channel transistor with its gate connected to its drain. Cascode transistors 52, 54 are n-channel transistors controlled by gate voltages Vref1 and Vref2. These reference voltages can be generated by an on-chip band-gap reference circuit, or with an external resistor to allow for compensation of the current to account for process, temperature, and power-supply voltage variations.

Multi-Level-Transitions

The staggered differential drivers of FIGS. 4, 5 can drive binary or multi-level data to the twisted-pair outputs TP+, TP−. The differential inputs IN+, IN− are CMOS-level inputs with a full-rail swing. Inputs IN+, IN− are either high at 5 volts or low at ground; intermediate voltages only occur briefly as the inputs change.

For binary signaling, the binary input BIN_IN is buffered to drive IN+, and inverted to drive IN−. For binary mode, IN+ is always the opposite of IN−. A binary high is transmitted when IN+ is high and IN− is low. A binary low is transmitted when IN+ is low and IN− is high.

Third State When IN+, IN− Both High

Multi-level signaling requires a third state, obtained when both IN+ and IN− are high. When both IN+ and IN− are high, both of the differential switch transistors 60, 62 of FIG. 5 are on, and the available current is split among the two outputs. Since only half the current is delivered to each output's termination, the voltage across each termination seen by a receiver is half the peak-to-peak voltage. Thus, a mid-level voltage is produced for the receiver when IN+ and IN− are both high.

Figure 6:
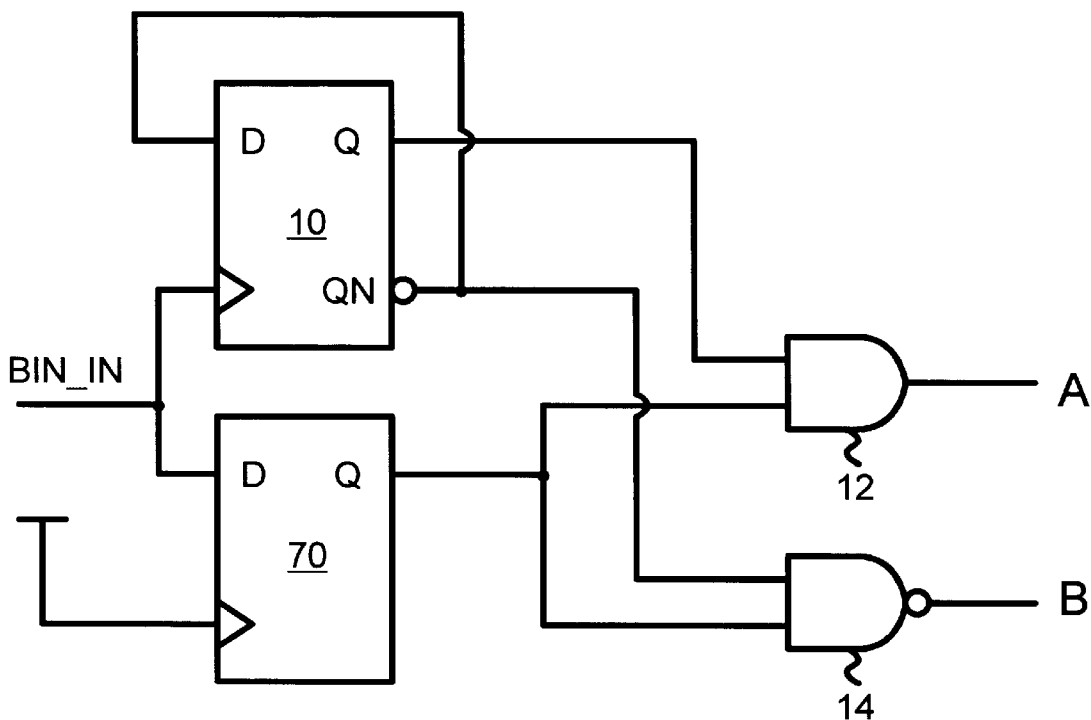
FIG. 6 is glitch-free binary-to-MLT-3 encoder.

Multi-Level-Transition Encoder—FIG. 6

FIG. 6 is glitch-free binary-to-MLT-3 encoder. For conversion from binary NRZI to multi-level MLT-3 encoding, each transition of the binary input BIN_IN must generate a transition of the MLT output. Each transition of the NRZI binary represents a one, so each transition of the MLT data stream also represents the binary one. A lack of transitions indicates a NRZI or MLT-3 zero.

Figure 1:
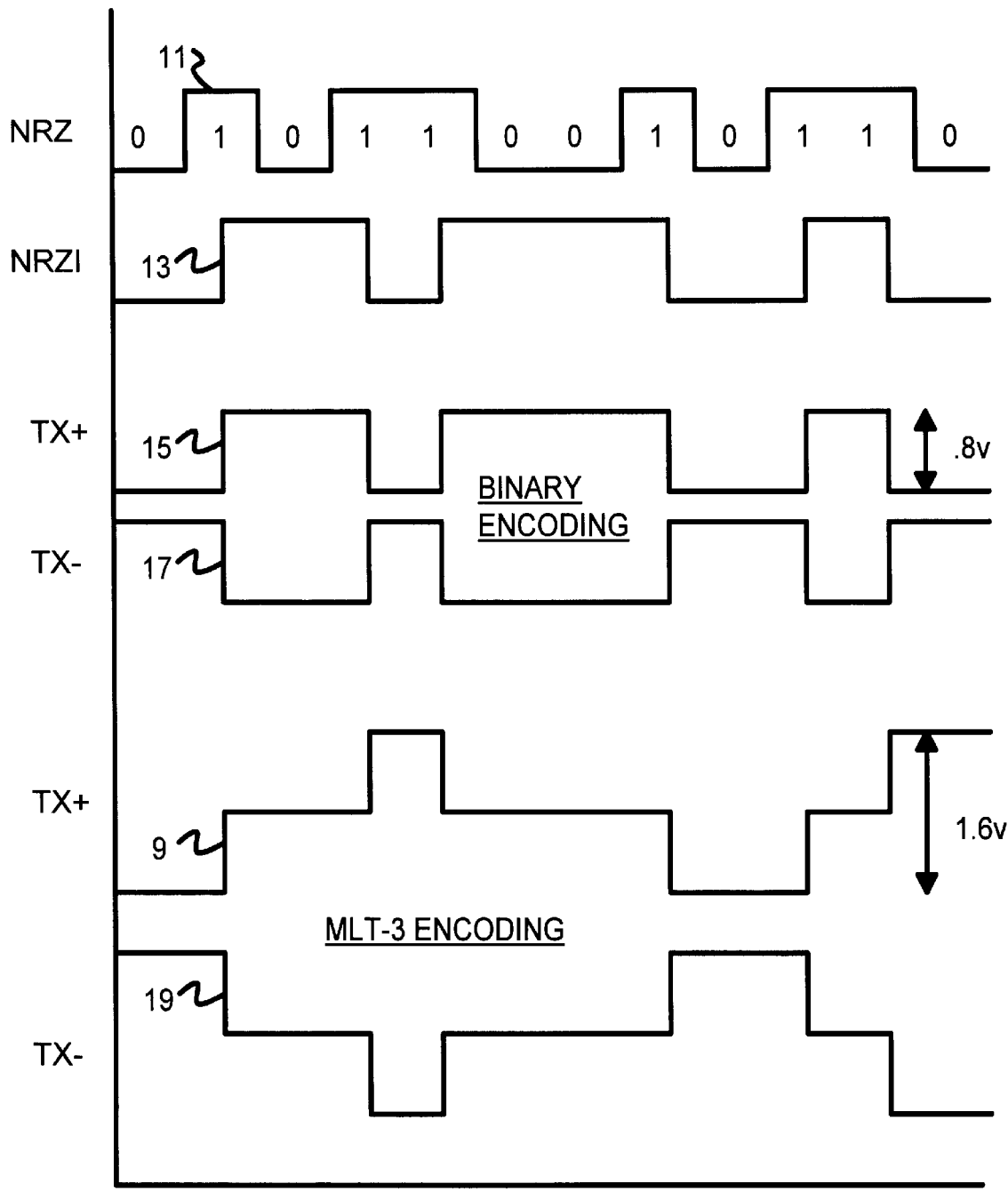
FIG. 1 is a waveform diagram of binary and MLT encoding.
Figure 2:
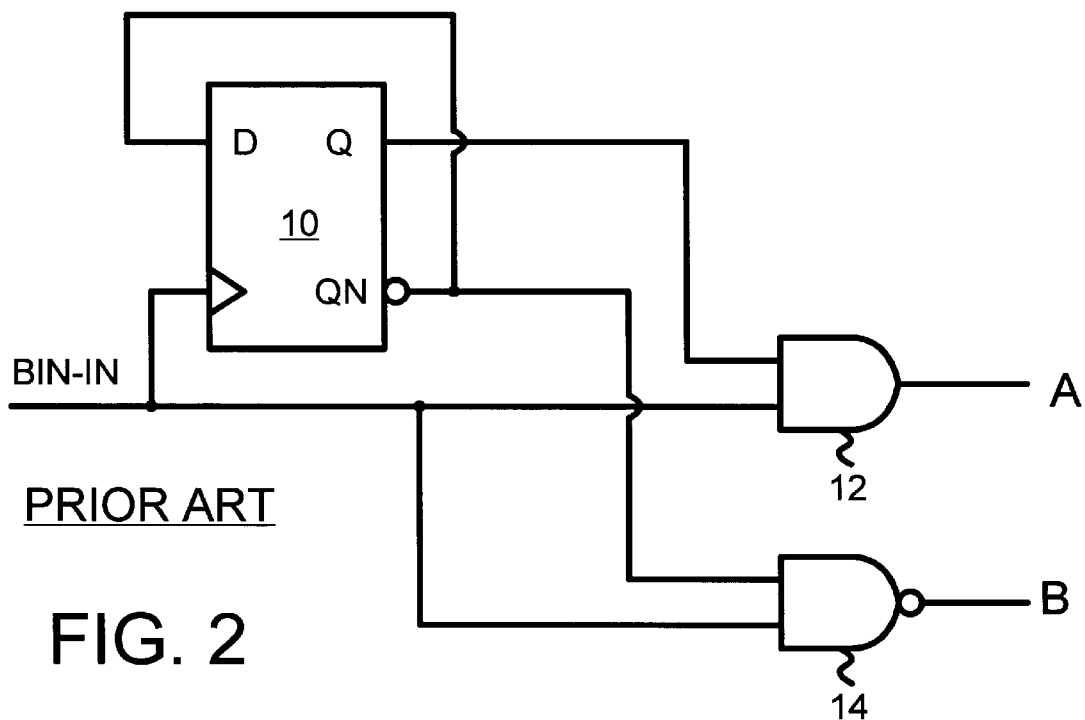
FIG. 2 is a diagram of a prior-art multi-level encoder.
Figure 3:
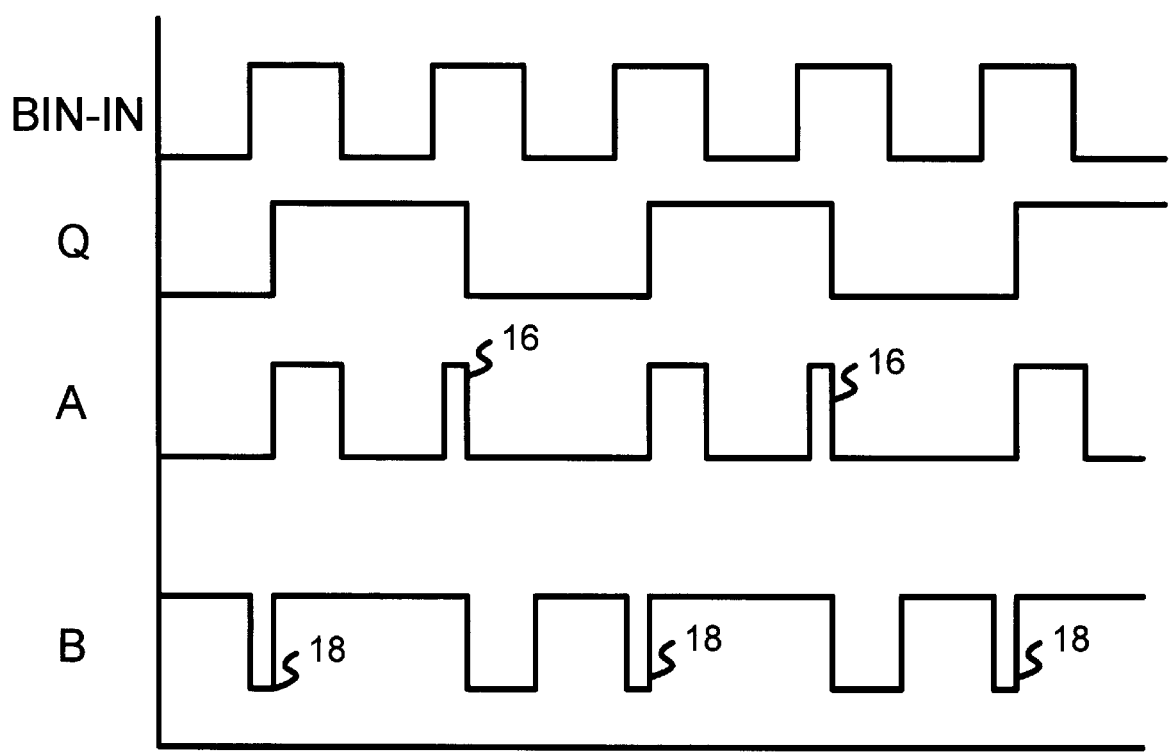
FIG. 3 is a waveform diagram of the binary-to-MLT encoder of FIG. 2.

Each rising edge of binary input BIN_IN causes flip-flop 10 to toggle Q and QN. Binary input BIN_IN is passed through dummy flip-flop 70, which is a transparent delay element with the clock tied to the power-supply, having about the same delay as the D-to-Q delay of flip-flop 10. Dummy flip-flop 70 acts as a transparent latch that is always on. It is inserted into the binary input path to match delays. Matching delays eliminates the glitches shown in FIG. 3. Thus BIN_IN arrives at AND gate 12 and NAND gate 14 at about the same time as Q and QN change at the rising edge of BIN_IN.

AND gate 12 outputs the logical AND of Q and the delayed BIN_IN, while NAND gate 14 outputs the logical NAND of QN and the delayed BIN_IN. Signals A and B are used to control the differential current drivers to sequence through three states: high, low, and mid-current states.

The apparatus of FIG. 6 is a sequencer that sequences through four states. Each high or low transition of binary input BIN_IN causes the next state to be entered. Signal A transitions through the sequence of 1-0-0-0 over two cycles of BIN_IN, while signal B sequences through 1-1-0-1. These particular sequences were chosen so that the output transitions through the high, mid, low, and mid-current states in MLT mode.

Figure 7:
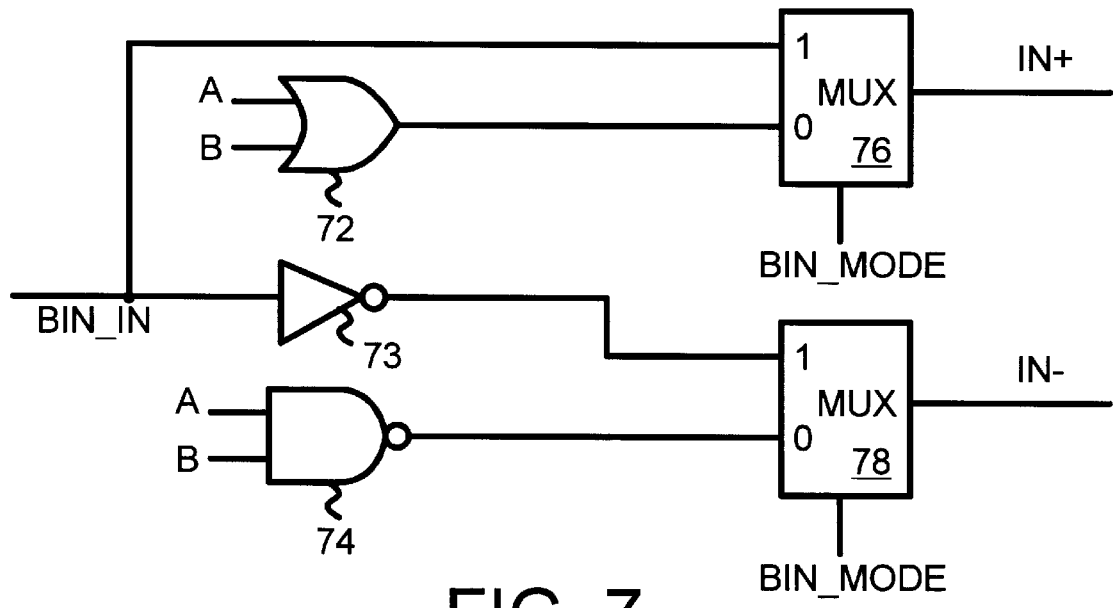
FIG. 7 is a diagram of a selector that drives the differential inputs to the differential current drivers with either binary or multi-level-encoded data.

Selection Binary Or MLT-Encoded A, B—FIG. 7

FIG. 7 is a diagram of a selector that drives the differential inputs to the differential current drivers with either binary of multi-level-encoded data. For binary mode, mode signal BIN_MODE causes multiplexer or mux 76 to connect the binary input BIN_IN to IN+. Inverter 73 inverts binary input BIN_IN which is passed through mux 78 during binary mode when BIN_MODE is high. Thus for binary mode, inputs IN+ and IN− are driven with the binary input and its inverse. Inputs IN+, IN− are then delayed A by the delay lines of FIG. 4 and converted to currents driven to the twisted-pair TP+, TP− outputs by the differential current drivers.

The selector of FIG. 7 also decodes and connects the MLT-encoded signals A, B from FIG. 6 to the differential current drivers of FIG. 4 during MLT mode. OR gate 72 and NAND gate 74 receive the A and B signals output from the binary-to-MLT converter of FIG. 6. OR gate 72 outputs the logical OR of A and B to mux 76, which passes it to input IN+ during MLT mode, when binary mode signal BIN_MODE is low. NAND gate 74 outputs the logical NAND of A and B to mux 78. Mux 78 passes (A NAND B) as the IN− input to the differential current drivers during MLT mode.

Since A and B sequence through, a fixed sequence, IN+ (A OR B) and IN− (A NAND B) also cycle through a fixed sequence. IN+ sequences through 1-1-0-1, while IN− sequences through 0-1-1-1. During the sequence when both IN+ and IN− are high, both differential switch transistors are on, causing the current to each output to be halved. This produces a mid-level voltage in the termination. When only one input is high and the other is low, then all the current is switched through one output, producing a high level. The other output generates a low level at the receiver. Table 1 shows these sequences and the resulting outputs.

TABLE 1

| MLT Encoding and Output | | | | |
|---|---|---|---|---|
| A | 1 | 0 | 0 | 0 |
| B | 1 | 1 | 0 | 1 |
| A + B (=IN+) | 1 | 1 | 0 | 1 |
| A NAND B (=IN−) | 0 | 1 | 1 | 1 |
| TP+ | H | Mid | L | Mid |
| TP− | L | Mid | H | Mid |

Although a fixed sequence is used for MLT mode, data is still transmitted by the timing of the transitions. The transitions, rather than the absolute voltage or current levels indicates the data, since NRZI encoding is used for the original binary data stream. Thus, a zero is indicated in either binary or MLT mode by the absence of a transition, or a wider pulse.

Dummy Flip-Flop—FIG. 8

FIG. 8 is a diagram of a dummy flip-flop used to match delays in the MLT encoder to eliminate glitches. Dummy flip-flop 70 is a D-tppe flip-flop with all its transmission gates open. The input IN to dummy flip-flop 70 passes through transmission gate 82, which has an n-channel pass transistor with a gate connected to power and a p-channel pass transistor with its gate connected to ground. Thus, both pass transistors are always on. Transmission gate 84 is likewise biased on.

NAND gate 84 and NOR gate 88 pass their inputs through to the outputs. Thus transmission gates 82, 84, NAND gate 84, and NOR gate 88 act as delay elements, matching the delay through flip-flop 10 of FIG. 6.

Advantages Of The Invention

The driver circuit for twisted-pair cables uses standard CMOS rather than BiCMOS to reduce cost and ease integration. EMI is reduced as is ground bounce on the driver chip by shaping transitions of the current-driven outputs.

Either binary-encoded or multi-level-transition-encoded data are driven with the same current driver circuit. An option in the current-driver circuit allows the twisted-pair to be driven for either binary or MLT-3 signals. An encoder converts binary signals to multi-level signals, reducing or eliminating glitches in a binary-to-MLT-3 encoder. The amount of current switched by each differential driver is doubled for multi-level mode to allow receivers to observe the smaller, multiple steps.

The same driver circuit can be used for either binary signaling or for multi-level signaling. A second circuit is not needed. The driver manufacturer does not have to build and stock two separate chips for the two applications, reducing costs.

Alternate Embodiments

Several other embodiments are contemplated by the inventors. For example, other sequences of signals can be used to encode MLT signals. The differential current driver may be altered for different current distributions. Additional or fewer differential current drivers may be used for greater or lesser current smoothing and EMI reduction. The current delivered by each differential current driver does not have to be the same.

Other kinds of encoding of data streams may be substituted. More complex multi-level-transition outputs may be used having more than three levels. The delay line can be implemented as a string of inverters, or with R-C elements. The first delay lines to the first differential current driver can be eliminated to reduce latency. Two delay lines with multiple outputs or taps can be substituted.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A staggered current-driver for driving a twisted-pair cable with smoothed waveforms to reduce electro-magnetic interference (EMI), the staggered current-driver comprising:

a first output for driving a first signal in the twisted-pair cable, the first output being a current-driven output for generating a small voltage swing on a termination, the small voltage swing being substantially less than a full swing from a power-supply voltage to a ground voltage;

a second output for driving a second signal in the twisted-pair cable to generate the small voltage swing in the termination, the first signal and the second signal together being a differential signal for transmitting binary data as a small difference in voltage between the first and second signals across the termination at a remote end of the twisted-pair cable;

a first input, the first input being a full-swing signal having a stable high state at the power-supply voltage and a stable low state at the ground voltage;

a second input, the second input being a full-swing signal having the stable high state at the power-supply voltage and the stable low state at the ground voltage;

a first delay line, receiving the first input, for generating a delayed first input;

a second delay line, receiving the second input, for generating a delayed second input;

a first differential current-driver, receiving the first input and the second input, for switching an immediate current to the first output or to the second output in response to the first input and the second input; and a second differential current-driver, receiving the delayed first input and the delayed second input, for switching a delayed current to the first output or to the second output in response to the delayed first input and the delayed second input, whereby the first and second inputs are delayed to the second differential current-driver to delay switching the delayed current relative to the first differential current-driver switching the immediate current.

2. The staggered current-driver of claim 1 further comprising:

a third delay line, receiving the delayed first input from the first delay line, for generating a double-delayed first input;

a fourth delay line, receiving the delayed second input from the second delay line, for generating a double-delayed second input; and a third differential current-driver, receiving the double-delayed first input and the double-delayed second input, for switching a double-delayed current to the first output or to the second output in response to the double-delayed first input and the double-delayed second input, wherein current switched by the staggered current-driver is staggered in time to smooth current switching and thereby reduce EMI from the twisted-pair cable generated by rapid changes in current driven.

3. The staggered current-driver of claim 2 further comprising:

a fifth delay line, receiving the double-delayed first input from the third delay line, for generating a triple-delayed first input;

a sixth delay line, receiving the double-delayed second input from the fourth delay line, for generating a triple-delayed second input; and a fourth differential current-driver, receiving the triple-delayed first input and the triple-delayed second input, for switching a triple-delayed current to the first output or to the second output in response to the triple-delayed first input and the triple-delayed second input, whereby current to the first and second outputs is switched over four instances in time.

4. The staggered current-driver of claim 3 wherein the immediate current, the delayed current, the double-delayed current, and the triple-delayed current each have one-quarter of a total switching current to the twisted-pair cable, whereby current driven to the first and second outputs is divided into four equal amounts of current switched at four points in time.

5. The staggered current-driver of claim 3 wherein the first, second, third, and fourth differential current-drivers each comprise pull-up transistors for supplying current from a power supply, but not having any pull-down transistors for sinking current to a ground, whereby current is sourced not sinked to the ground by the differential current-drivers.

6. The staggered current-driver of claim 3 wherein the first, second, third, and fourth differential current-drivers each comprise:

current-source p-channel transistors, coupled to supply current from a power supply in response to a current-source bias voltage;

a first differential switch p-channel transistor, coupled to the current-source p-channel transistors, for switching the current supplied by the current-source p-channel transistors to the first output in response to a first input received; and a second differential switch p-channel transistor, coupled to the current-source p-channel transistors, for switching the current supplied by the current-source p-channel transistors to the second output in response to a second input received.

7. The staggered current-driver of claim 6 wherein the first, second, third, and fourth differential current-drivers each further comprise:

additional current-source p-channel transistors, coupled to supply additional current from the power supply in response to the current-source bias voltage;

a mode p-channel transistor, coupled to the additional current-source p-channel transistors, for connecting the additional current to the first and second differential switch transistors in response to a mode signal, whereby the additional current is switched to the first and second outputs in response to the mode signal, increasing the small voltage swing across the termination.

8. The staggered current-driver of claim 7 wherein the mode signal connects the additional current during a multi-level-transition MLT mode but not during a binary mode, the MLT mode having a mid-level state at a voltage substantially in the middle of the small voltage swing.

9. The staggered current-driver of claim 8 wherein during the MLT mode to output the mid-level state, the first input and the second input are both driven to either the high or the low state, wherein both the first and second differential switch p-channel transistors conduct one-half of the current from the current-source transistors, whereby the mid-level state is driven by enabling both differential transistors.

10. The staggered current-driver of claim 3 wherein the first output is connected to the first signal in the twisted-pair cable by a transformer, the transformer isolating the staggered current-driver from the twisted-pair cable for direct current D.C. but passing small-signal alternating current A.C.; and wherein the second output is connected to the second signal in the twisted-pair cable by a transformer, the transformer isolating the staggered current-driver from the twisted-pair cable for direct current D.C. but passing small-signal alternating current A.C., whereby the twisted-pair cable is isolated.

11. The staggered current-driver of claim 3 wherein the small voltage swing of the first and second outputs is less than half of the full swing from the power-supply voltage to the ground voltage.

12. A multi-level and binary current-driver for a twisted-pair cable comprising:

a plurality of differential current drivers each having a pair of inputs and a pair of outputs, the pair of outputs for all differential current drivers connected to drive a differential pair in the twisted-pair cable;

delay line means for successively delaying the pair of inputs to successive differential current drivers such that each differential current driver receives changes on the pair of inputs at different times;

a mode signal for indicating when binary data and when multi-level data is to be output from the plurality of differential current drivers;

a multi-level encoder, receiving a binary data stream, for converting the binary data stream into a multi-level-transition data stream;

multiplexer means, receiving the binary data stream and receiving the multi-level-transition data stream from the multi-level encoder, for outputting the pair of inputs to the delay line means in response to the mode signal;

wherein the pair of inputs comprise a high signal and a low signal when the binary data stream is output from the multiplexer means, but the pair of inputs comprising a high signal and a low signal or two high signals when the multi-level-transition data stream is output from the multiplexer means, whereby binary and multi-level data are output by the plurality of differential current drivers.

13. The multi-level and binary current-driver of claim 12 wherein electro-magnetic interference (EMI) from the twisted-pair cable is reduced by successively delaying current switching from successive differential current drivers.

14. The multi-level and binary current-driver of claim 12 wherein the multi-level encoder comprises:

a toggle flip-flop for toggling toggled outputs in response to the binary data stream;

a dummy flip-flop for delaying the binary data stream by a similar delay to a delay through the toggle flip-flop to generate a delayed binary data stream;

decode means, receiving the toggled outputs from the toggle flip-flop and receiving the delayed binary data stream from the dummy flip-flop, for outputting multiple signals encoding the binary data stream as the multi-level-transition data stream.

15. The multi-level and binary current-driver of claim 14 wherein the differential current drivers switch a current among the differential pair to generate a small voltage swing in a termination at a remote end of the twisted-pair cable.

16. The multi-level and binary current-driver of claim 15 wherein each of the plurality of differential current drivers further comprises:

a current-source p-channel transistor connected to a power supply for outputting a constant current;

a first p-channel differential transistor and a second p-channel differential transistor connected to the current-source p-channel transistor to receive the constant current, each p-channel differential transistor controlled by one of the pair of inputs and outputting the constant current to one of the pair of outputs in response to the pair of inputs;

an additional current-source p-channel transistor connected to the power supply for outputting a constant additional current;

a mode p-channel transistor, coupled between the additional current-source p-channel transistor and the first and second p-channel differential transistors, to increase current switched by the first and second differential p-channel transistors in response to the mode signal indicating that the multi-level-transition data stream is to be outputted;

the first and second p-channel differential transistors also outputting the constant additional current when the multi-level-transition data stream is to be outputted, whereby current switched is increased for the multi-level-transition data stream.

17. The multi-level and binary current-driver of claim 16 wherein the constant current is substantially equal to the constant additional current, whereby current switched is doubled for outputting multi-level-transition data.

18. A differential driver comprising:

a not-return-to-zero-invert-on-ones NRZI binary input;

an inverter, receiving the NRZI binary input, for outputting an inverse NRZI binary signal;

a binary-to-multi-level encoder, receiving the NRZI binary input, for converting the NRZI binary input to a first and a second multi-level-transition MLT output encoding multi-level-data;

a mux, responsive to a binary/MLT mode signal, for outputting the NRZI binary input and the inverse NRZI binary signal when the binary/MLT mode signal indicates binary mode, but outputting the first and second MLT output when the binary/MLT mode signal indicates MLT mode, the mux outputting a first signal and a second signal;

a first delay line, receiving the first signal from the mux, for delaying the first signal to generate successively delayed first signals having successively larger delays relative to the first signal;

a second delay line, receiving the second signal from the mux, for delaying the second signal to generate successively delayed second signals having successively larger delays relative to the second signal, the successively delayed second signals having substantially matched delays to the successively delayed first signals; and a plurality of differential current drivers, receiving the successively delayed first signals and the successively delayed second signals, for successively switching current between a first and a second output, wherein the plurality of differential current drivers begin switching current at successively different times, reducing electro-magnetic interference (EMI) generated by rapid changes in current.

19. The differential driver of claim 18 wherein the first signal and the second signal have substantially a same voltage when a mid-level is outputted by the plurality of differential current drivers, the same voltage splitting currents from the plurality of current drivers among the first and second outputs to produce the mid-level output.

* * * * *